(12) United States Patent
Kim

(10) Patent No.: US 7,659,603 B2
(45) Date of Patent: Feb. 9, 2010

(54) SEMICONDUCTOR AND METHOD FOR MANUFACTURING THE SAME

(75) Inventor: Sang-Chul Kim, Seoul (KR)

(73) Assignee: Dongbu HiTek Co., Ltd., Seoul (KR)

( * ) Notice: Subject to any disclaimer, the term of this patent is extended or adjusted under 35 U.S.C. 154(b) by 56 days.

(21) Appl. No.: 11/846,897

(22) Filed: Aug. 29, 2007

(65) Prior Publication Data

US 2008/0057695 A1    Mar. 6, 2008

(30) Foreign Application Priority Data

Aug. 31, 2006    (KR) .................... 10-2006-0083219

(51) Int. Cl.
*H01L 29/06* (2006.01)
*H01L 27/108* (2006.01)
(52) U.S. Cl. ...................... 257/618; 257/303
(58) Field of Classification Search ................. 438/612, 438/110, 106, 613; 257/758, E21.579, E21.582, 257/E23.152, E23.153
See application file for complete search history.

(56) References Cited

U.S. PATENT DOCUMENTS

2004/0210858 A1* 10/2004 Hayashi .................... 716/4
2005/0140012 A1*  6/2005 Jung ....................... 257/762
2007/0126056 A1*  6/2007 Hirler ..................... 257/330

OTHER PUBLICATIONS

Wolf et al., "Silicon Processing for the VLSI Era", 2000, Lattice press, pp. 827-828.*

* cited by examiner

*Primary Examiner*—Thomas L Dickey
*Assistant Examiner*—Nikolay Yushin
(74) *Attorney, Agent, or Firm*—Sherr & Vaughn, PLLC

(57) ABSTRACT

A semiconductor device includes a substrate formed with a predetermined trench, a plurality of devices fixed into the trench, an etch stop layer on an entire surface of the substrate including the devices while selectively exposing the devices, an interlayer dielectric layer on the etch stop layer, in which the interlayer dielectric layer includes a predetermined via hole and a predetermined trench, and a via plug and a metal line formed on the interlayer dielectric layer while filling the via hole and the trench.

8 Claims, 6 Drawing Sheets

SEMICONDUCTOR AND METHOD FOR MANUFACTURING THE SAME

Figure 1:
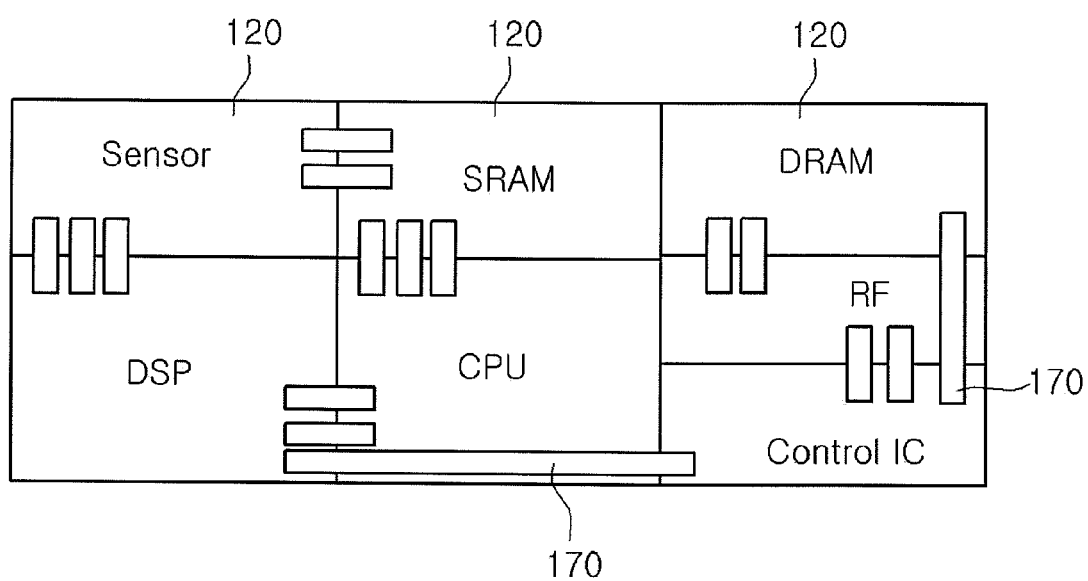

The present application claims the benefit under 35 U.S.C. §119 of Korean Patent Application No. 10-2006-0083219, filed Aug. 31, 2006, which is hereby incorporated by reference in its entirety.

BACKGROUND

With the development of a semiconductor IC technology, a system on a chip (SoC) technology has been examined in an attempt to integrate analog and radio frequency (RF) functions, a central processor unit (CPU), and CMOS sensors on one chip. However, it has proven difficult to integrate various types of devices having various design rules on one chip, so that the SoC process is faced with various difficulties.

Recently, a "system in package" (SIP) technology has been developed to vertically integrate devices using a through electrode. However, SiP technology, itself, has many problems in terms of fabrication of the through electrode and heat dissipation of the interlayer devices.

In instances when horizontal integration is employed instead of the vertical integration, devices are integrated on a printed circuit board (PCB) after sawing and wire bonding. In such cases, the horizontal integration scheme has a limitation preventing high integration of the devices due to the occupation of a large space, and may have problems relative to noise in wire bonding and interconnection of a PCB substrate.

SUMMARY

Embodiments relate to a semiconductor device that includes a substrate including a first trench; a plurality of devices located in the trench; an etch stop layer on substantially an entire surface of the substrate including the devices and selectively exposing at least a portion of the devices; an interlayer dielectric layer on the etch stop layer, in which the interlayer dielectric layer includes a via hole and a second trench; and a via plug and a metal line, formed on the interlayer dielectric layer, filling the via hole and the second trench.

Embodiments relate to a semiconductor device that includes a first interlayer dielectric layer on a substrate including a first trench; a plurality of device located within the trench; an etch stop layer on substantially an entire surface of the substrate including the devices while selectively exposing at least a portion of the devices; a second interlayer dielectric layer on the etch stop layer, in which the second interlayer dielectric layer includes a predetermined via hole and a second trench; and a via plug and a metal line, formed on the second interlayer dielectric layer, and filling the via hole and the second trench.

Embodiments relate to method for manufacturing a semiconductor device. In accordance with this method, the following steps are performed: forming a first trench in a substrate; fixing a plurality of devices in the trench; forming an etch stop layer on substantially an entire surface of the substrate including the devices; forming an interlayer dielectric layer on the etch stop layer; etching a via hole and a second trench in the interlayer dielectric layer; exposing at least a portion of the devices under the via hole by etching the etch stop layer in a lower portion of the via hole; and forming a via plug and a metal line by filling the via hole and the trench.

Embodiments relate to method for manufacturing a semiconductor device. In accordance with this method, the following steps are performed: forming a first interlayer dielectric layer on a substrate; forming a first trench in the first interlayer dielectric layer; fixing a plurality of devices in the trench; forming an etch stop layer on substantially an entire surface of the substrate including the devices; forming a second interlayer dielectric layer on the etch stop layer; forming a via hole and a second trench by etching the second interlayer dielectric layer; and exposing devices under the via hole by etching the etch stop layer in a lower portion of the via hole.

DRAWINGS

Example FIG. 1 is a plan view showing a semiconductor device according to embodiments.

Figure 2:
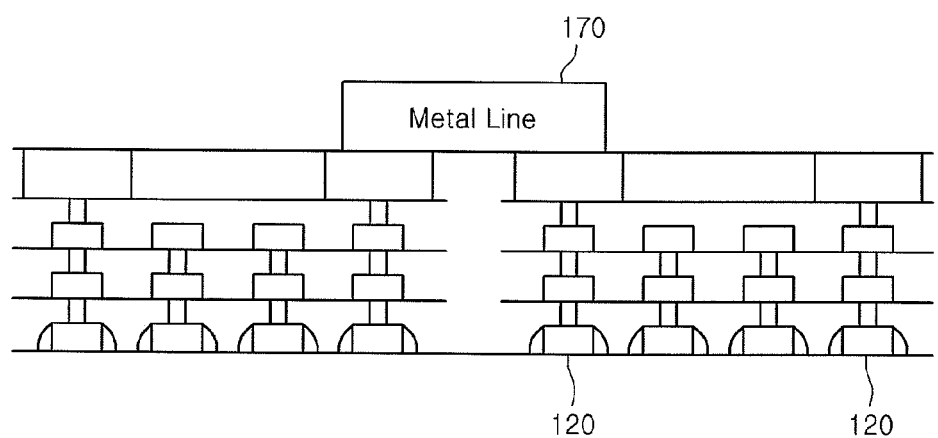
Figure 3:
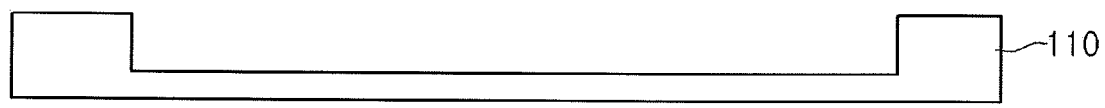

Example FIG. 2 is a sectional view showing a semiconductor device according to embodiments.

Example FIGS. 3 to 10 are sectional views showing a method for manufacturing a semiconductor device according to embodiments.

Figure 11:
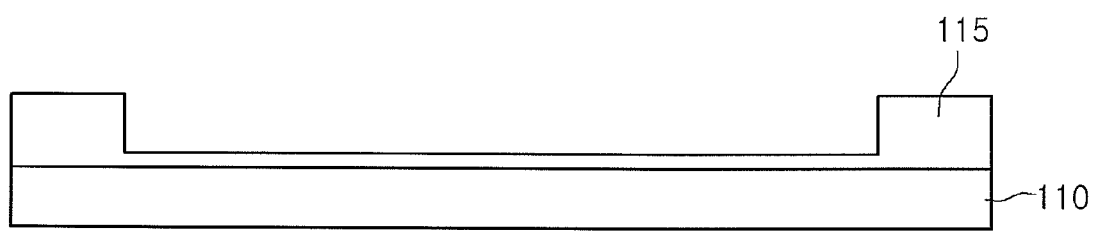
Figure 12:
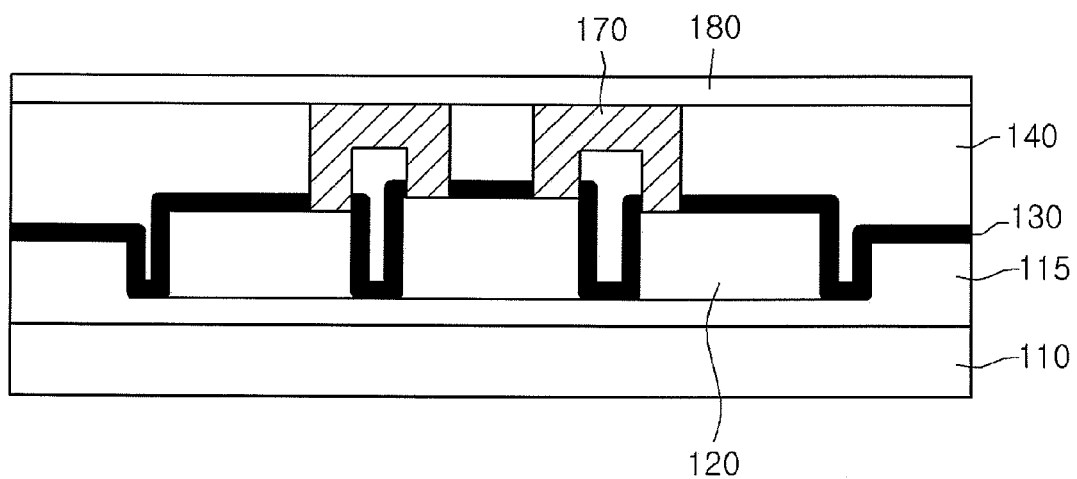

Example FIGS. 11 to 12 are sectional views showing a method for manufacturing a semiconductor device according to embodiments.

DESCRIPTION

Hereinafter, a semiconductor device and a method for manufacturing the same according to embodiments will be described with accompanying drawings. In the description of embodiments, it will be understood that when a layer (or film) is referred to as being 'on' another layer or substrate, it can be directly on another layer or substrate, or intervening layers may also be present. Further, it will be understood that when a layer is referred to as being 'under' another layer, it can be directly under another layer, and one or more intervening layers may also be present. In addition, it will also be understood that when a layer is referred to as being 'between' two layers, it can be the only layer between the two layers, or one or more intervening layers may also be present.

Figure 10:
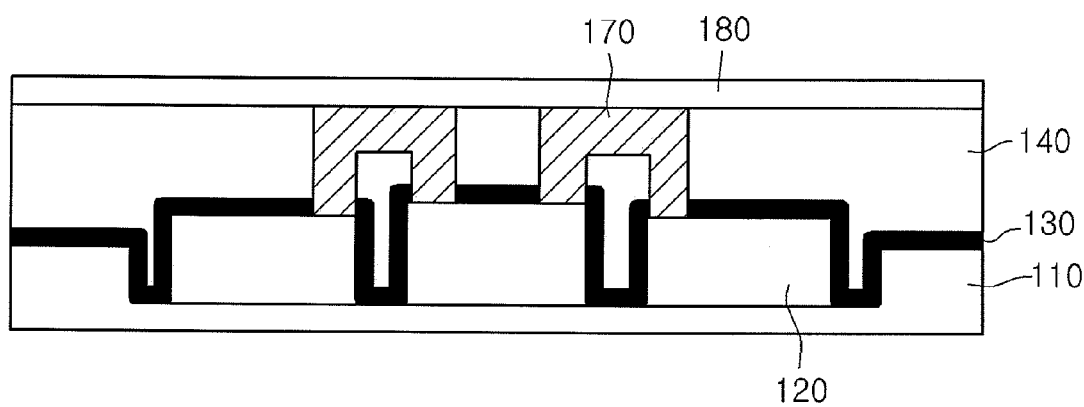

Example FIG. 1 is a plan view showing a semiconductor device according to embodiments, and example FIG. 2 is a sectional view showing a semiconductor device according to the embodiments. In addition, example FIG. 10 is also a sectional view showing a semiconductor device according to the embodiments.

The semiconductor device (see, example FIG. 10) includes a substrate 110 provided with a predetermined trench, a plurality of devices 120 fixed into the trench with a predetermined interval, an etch stop layer 130 formed on the entire surface of the substrate 110 including the devices 120 while selectively exposing the devices 120, an interlayer dielectric layer 140 including a via hole and the trench, which is formed on the etch stop layer, and a metal line 170 and a via plug formed on the interlayer dielectric layer 140 while filling the via hole and the trench.

In addition, a passivation layer 180 may be formed on the entire surface of the substrate including the metal line 170. In this case, the depth of the trench is lower than the height of the lowest device of the devices 120. The etch stop layer 130 may include a nitride layer (e.g., SiN).

The trench is formed in the substrate 110, devices having various heights and sizes are fixed into the trench, and the interlayer dielectric layer 140 is formed on the resultant structure, so that the devices can be stably fixed into the trench even when devices having various heights and sizes are employed. Thus, the topology of the interlayer dielectric layer 140 can be stably formed.

In other words, as shown in example FIG. 1, a semiconductor device may be manufactured through a new high-integration IC manufacturing scheme, wherein the semiconductor device is integrated by connecting unit devices, such as a CPU, an SRAM, a DRAM, a flash memory, a logic device, a power IC, a control IC, an RF IC, and a sensor chip formed on different wafers, to each other through the metal line 170.

Example FIG. 2 is a plan view showing an integrated circuit (IC) manufactured through "system by interconnection" (SbI) as just described.

A semiconductor device may also be manufactured similarly except that a plurality of devices (see, example FIGS. 11 and 12) are integrated after forming the first interlayer dielectric layer 115 on the substrate 110 and forming a trench in the first interlayer dielectric layer 115.

Since the trench is formed in the interlayer dielectric layer, the trench can be more easily formed as compared with a trench formed by etching a substrate. Thus, when devices are easily fixed to an interlayer dielectric layer, the semiconductor device may be manufactured more easily.

Example FIGS. 3 to 10 are sectional views showing a method for manufacturing a semiconductor device according to embodiments. As shown in example FIG. 3, a predetermined trench is formed in the substrate 110, thereby creating a space for devices. In this case, the depth of the trench is lower than the height of the lowest device (or the shortest device) of the devices 120. Accordingly, even if devices 120 having various heights and sizes are employed, the devices 120 can be stably fixed into the trench, and the topology of the interlayer dielectric layer 140 can be stably formed in the following process.

Figure 4:
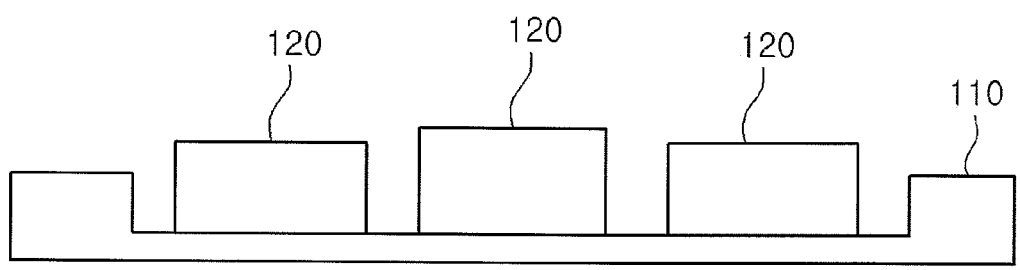
Figure 5:
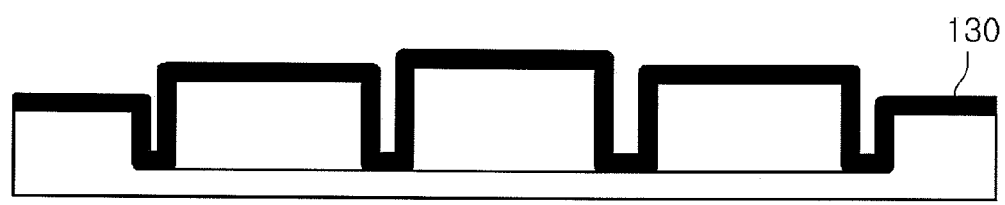

Next, as shown in example FIG. 4, the devices 120 are fixed into the trench with, for example, a predetermined interval. The devices 120 may be fixed by resin bond or similar material. Thereafter, as shown in example FIG. 5, the etch stop layer 130 is formed on the entire surface of the substrate 110 including the devices 120. The etch stop layer 130 may include a nitride layer (e.g., SiN). For example, the SiN is deposited through a CVD in order to form an etch stop layer in the following process.

Figure 6:
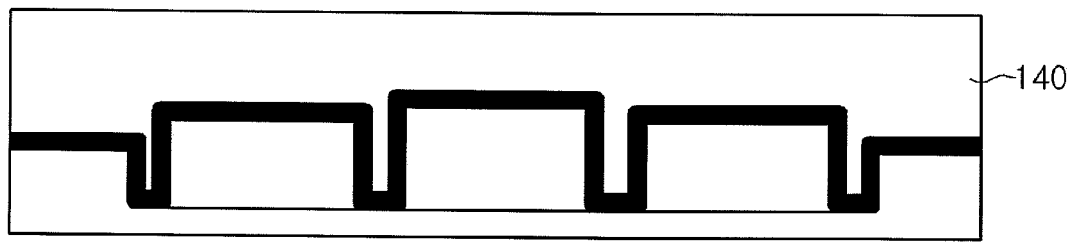

Thereafter, as shown in example FIG. 6, the interlayer dielectric layer 140 is formed on the etch stop layer 130. For example, the $SiO_2$ may be deposited in order to form the interlayer dielectric layer 140. In addition, after the interlayer dielectric layer 140 is formed, a planarization process such as a CMP process may be performed with respect to the resultant structure.

Figure 7:
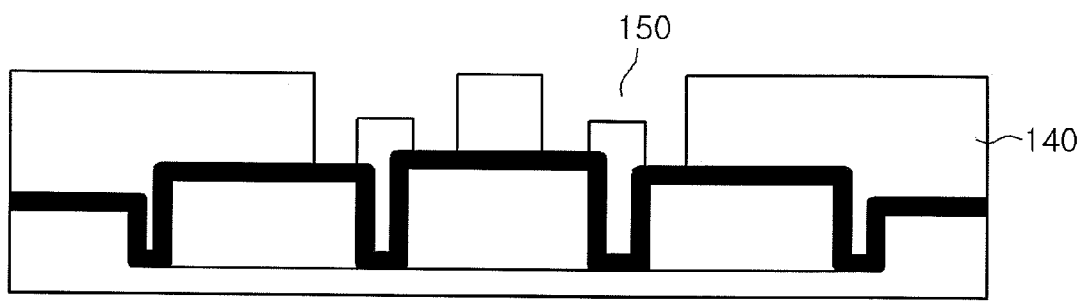

Then, as shown in example FIG. 7, the interlayer dielectric layer 140 is etched, thereby forming the via hole and the trench 150. For example, via hole and trench patterns may be formed through a dual damascene process. In this case, a trench may be formed after forming a via hole, or the via hole may be formed after forming the trench. In this case, since the etch stop layer 130 exists in a lower portion, the via hole can be stably formed even if the devices 120 have different thicknesses.

Figure 8:
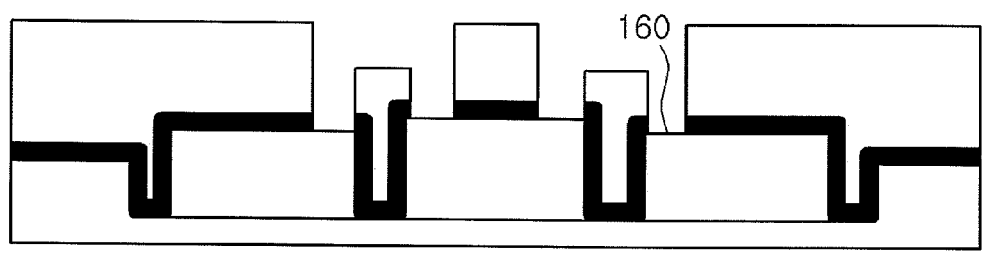

Thereafter, as shown in example FIG. 8, the etch stop layer 130 in the lower portion of the via hole is etched, thereby exposing at least a portion of the devices 120 under the via hole (reference number 160). In this case, only the etch stop layer in the lower portion of the via hole may be selectively etched through a dry etching process such as a reactive ion etching (RIE) process.

Figure 9:
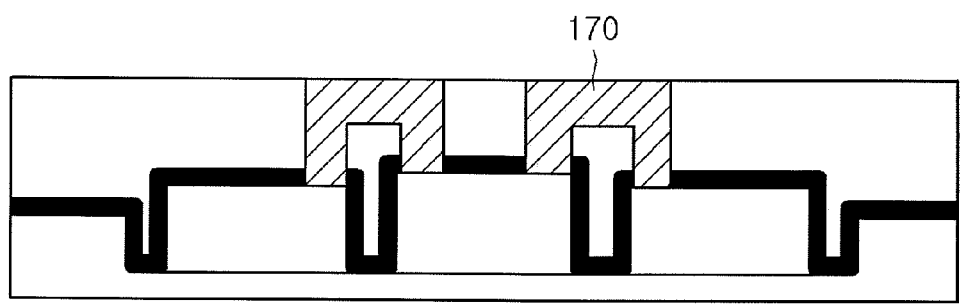

Then, as shown in example FIG. 9, a via plug and a metal line 170 are formed on the substrate including the exposed devices by filling the via hole and the trench. In one example, the via plug and the metal line may include copper (Co), tungsten (W), aluminum (Al), etc.

In addition, a gap fill process may be performed by using metal and the resultant structure may be planarized through a metal CMP. Then, as shown in example FIG. 10, a passivation layer 180 is formed on the entire surface of the substrate including the metal line 170, thereby completing the above semiconductor integration.

Example FIGS. 11 to 12 are sectional views also showing a method for manufacturing a semiconductor device according to embodiments. A method for manufacturing a semiconductor device is performed similarly to that described above, except that the first interlayer dielectric layer 115 is formed on the substrate 110, and a trench is formed in the first interlayer dielectric layer 115, thereby integrating a plurality of devices (see, Example FIGS. 11 and 12).

According to this method, because a trench is formed on the first interlayer dielectric layer 115, the trench can be more easily formed as compared with a trench formed by etching the substrate 110. Thus, when the devices 120 are easily fixed to the first interlayer dielectric layer, it permits easier manufacturing of a semiconductor device.

As described above, according to the semiconductor device and the method for manufacturing the same according to the embodiments, a new device integrating method and a new process sequence can be achieved by employing the existing metal interconnection process such as a dual damascene process.

In addition, according to the embodiments, even devices having different thicknesses can be highly and effectively integrated without an additional process.

Although embodiments have been described with reference to a number of illustrative embodiments thereof, it should be understood that numerous other modifications and embodiments can be devised by those skilled in the art that will fall within the spirit and scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

What is claimed is:

1. A semiconductor device comprising:
    a substrate including a first trench;
    a plurality of devices located in the trench at a predetermined interval and arranged in a direction parallel to a surface of the substrate;
    an etch stop layer on substantially an entire surface of the substrate including the devices and selectively exposing at least a portion of the devices;
    an interlayer dielectric layer on the etch stop layer, in which the interlayer dielectric layer includes a via hole and a second trench; and
    a via plug and a metal line, formed on the interlayer dielectric layer, filling the via hole and the second trench.

2. The semiconductor device of claim 1, further comprising a passivation layer on substantially the entire surface of the substrate including the metal line.

3. The semiconductor device of claim 1, wherein a depth of the first trench is lower than a height of a lowest device of the devices.

4. The semiconductor device of claim 1, wherein the device is exposed through the via hole.

5. A semiconductor device comprising:
    a first interlayer dielectric layer on a substrate including a first trench;
    a plurality of device located within the first trench at a predetermined interval and arranged in a direction parallel to a surface of the substrate;
    an etch stop layer on substantially an entire surface of the substrate including the devices while selectively exposing at least a portion of the devices;
    a second interlayer dielectric layer on the etch stop layer, in which the second interlayer dielectric layer includes a predetermined via hole and a second trench; and a via plug and a metal line, formed on the second interlayer dielectric layer, and filling the via hole and the second trench.

6. The semiconductor device of claim 5, further comprising a passivation layer on substantially an entire surface of the substrate including the metal line.

7. The semiconductor device of claim 5, wherein a depth of the trench is lower than a height of a lowest device of the devices.

8. The semiconductor device of claim 5, wherein at least a portion of a particular device is exposed through the via hole.

* * * * *